United States Patent
Le Pailleur et al.

(10) Patent No.: US 6,836,230 B2
(45) Date of Patent: Dec. 28, 2004

(54) DEVICE AND METHOD FOR GENERATING DIGITAL SIGNALS EACH CODING A VALUE OF AN ANALOG SIGNAL

(75) Inventors: Laurent Le Pailleur, Voreppe (FR); Knut Hovring Riisnaes, Vollen (NO); Ovidiu Vermesan, Stabekk (NO)

(73) Assignees: STMicroelectronics S.A. (FR); Idex ASA (NO)

( * ) Notice: Subject to any disclaimer, the term of this patent is extended or adjusted under 35 U.S.C. 154(b) by 0 days.

(21) Appl. No.: 10/421,380

(22) Filed: Apr. 22, 2003

(65) Prior Publication Data

US 2004/0027263 A1 Feb. 12, 2004

(30) Foreign Application Priority Data

Apr. 23, 2002 (EP) .............................................. 02291025

(51) Int. Cl.[7] .............................. H03M 1/12; G06K 9/00
(52) U.S. Cl. ....................................... 341/141; 382/124
(58) Field of Search ........................... 341/141; 382/124

(56) References Cited

U.S. PATENT DOCUMENTS

| | | | |
|---|---|---|---|
| 3,852,714 A | | 12/1974 | Carson ................. 340/146.3 F |
| 5,166,685 A | * | 11/1992 | Campbell et al. ........... 341/141 |
| 5,963,679 A | * | 10/1999 | Setlak ......................... 382/312 |
| 5,991,467 A | * | 11/1999 | Kamiko ....................... 382/312 |
| 6,631,201 B1 | * | 10/2003 | Dickinson et al. .......... 382/124 |

OTHER PUBLICATIONS

Blokin–Mechtalin, et al., "Multichannel Instrumental Analog–Digital Converter for Bus–Modular Systems", *Measurement Techniques, Consultants Bureau*, New York, vol. 34, no. 11, pp. 1100–1102, dated Nov. 1, 1991, XP000307710.

European Search Report, EP 02291025, dated Mar. 21, 2003.

* cited by examiner

*Primary Examiner*—Howard L. Williams
(74) *Attorney, Agent, or Firm*—Jenkens & Gilchrist, P.C.

(57) ABSTRACT

A number P of single analog inputs receive an analog signal having a frequency F from a sensor electrode. A single digital output sequentially generates a number P of first digital signals coding the amplitude values of the analog signal. A first multiplexer with a number M of multiple analog inputs with a number N of single analog inputs receives the analog signal and outputs the analog signal on a multiple analog output with a number N of second single analog outputs. A phase sensitive amplifier with a number N of single analog inputs and a number N of single analog outputs is connected to the second single analog outputs of the fist multiplexer. A second multiplexer with a number N of single analog inputs and a single analog output is connected to the single analog outputs of the phase sensitive amplifier. An analog to digital converter with a single analog input tied to the single analog output of the second multiplexer and a single digital output tied to the single digital output sequentially generates the number P of first digital signals coding the amplitude values of the analog signal.

26 Claims, 4 Drawing Sheets

DEVICE AND METHOD FOR GENERATING DIGITAL SIGNALS EACH CODING A VALUE OF AN ANALOG SIGNAL

CROSS-REFERENCE

This application claims priority from European Application for Patent No. 02291025.1 filed on Apr. 23, 2002, the disclosure of which is hereby incorporated by reference.

BACKGROUND OF THE INVENTION

1. Technical Field of the Invention

The present invention relates to the generation of digital signals coding amplitude values of different analog signals having a set frequency.

2. Description of Related Art

Sensor electrodes, detecting physical features or events, produce a periodic wave tension value (an analog signal) whose amplitude is a function of the physical features or events detected by the sensor. It is useful for further processing to digitize the amplitude values of the analog signal. It is known in the prior art to use analog to digital converters (ADCs) for generating each digital signal that codes the amplitude values of a detected analog signal.

Some state of the art devices, with an ADC able to sample many points in a period of the analog signal, determine the amplitude of the analog signal by the maximum of a curve comprising many digital points, with each digital point coding an analog point on the analog signal. A device with many sensors is cumbersome because there are as many ADCs as sensors. Furthermore, high-speed ADCs consume a lot of power during operation. This poses a problem for miniaturized electronic devices, such as organizers or mobile phones.

One solution is to valuate the amplitude of the analog signal before digital conversion, for example, with a filter or otherwise. This allows the use of lower speed ADCs converting only one value per period. Thus, the individual ADC is less cumbersome and consumes less power. However, this does not satisfy the needs of miniaturization, because with a large number of ADCs the power consumption is still high and a device is still cumbersome. Also, another problem arises when many ADCs are used because of the necessary calibration to lessen the resolution loss that occurs when all of the ADCs in a device are not identical.

Another solution is to reduce the number of ADCs by successively connecting a group of sensors to the same ADC via an analog multiplexer. However, it is difficult to substantially reduce the number of ADCs because the same sensor can be connected again to the ADC only after a number of periods of the analog signal equal to the number or, at best, to half the number of the sensors of the group. Each valuation of the amplitude needs a total period or, at best, a half period of the analog signal received by an ADC. The smaller the quantity of ADCs, the greater the time separating two samples of the same analog signal. For example, connecting each sensor during a full period to a unique ADC requires again connecting the same sensor after a number of periods equal to the total number of sensors. This delay between two digital conversions for the same analog signal is not satisfactory when amplitude values vary at a high rate. If a small number of sensors are connected to the same ADC, this still will require a large number of ADCs for all the sensors. Thus, the resulting structure is still cumbersome and still consumes a lot of power during operation.

SUMMARY OF THE INVENTION

One embodiment according to the principles of the present invention is a particularly compact device having a number (P) of first single analog inputs, each receiving a first analog signal having a frequency (F) from a sensor electrode, and a first single digital output for sequentially generating P first digital signals coding the amplitude values of the first analog signals.

An embodiment according to the principles of the present invention comprises:

1) a first multiplexer having a number (M) of first multiple analog inputs with each input comprising a number (N) of second single analog inputs, each receiving an analog signal, with the numbers N and M chosen so that their product is at least equal to P, a first multiple analog output having N second single analog outputs, and a first command input connecting the first multiple analog output sequentially to one of the first multiple analog inputs;

2) a phase sensitive amplifier having N third single analog inputs, each connected to a separate second single analog output of the first multiplexer, N third single analog outputs, and a second command input for generating on each third single analog output an analog amplitude value of the analog signal received on corresponding third analog input;

3) a second multiplexer having N fourth single analog inputs, each tied to a separate third single analog output of the phase sensitive amplifier, a fourth single analog output, and a third command input for connecting the fourth single analog output sequentially to one of the fourth single analog inputs;

4) an ADC having a fifth single analog input tied to the fourth single analog output of the second multiplexer, a second single digital output tied to a first output of the device, and a fourth command input for generating a digital signal coding the amplitude of the analog value received on the fifth single analog input; and 5) a front-end controller operable for setting the first command input with a first new value, the second command input with a first pulse value at the beginning of each period of the first analog signal, the third command input with a succession of N second new values, and the fourth command input with a succession of N second pulse values at a time delayed after the beginning of each period of the first analog signal.

The present invention allows considerable reduction of the number of ADCs, and therefore, the size of the device. Preferably, N is equal to the number of analog amplitude values for which the ADC is suited to generate digital signals coding each analog amplitude value during a period of the first analog signal. Further, each first new value is set for connecting the first multiple analog output on a different first multiple analog input during a period of the first analog signal so as to connect the first multiple analog output on all the first multiple analog inputs during M periods of the first analog signal. Also, each second new value is set for connecting the fourth single analog output on a different fourth single analog input so as to connect the fourth single analog output on all the fourth single analog inputs during a period of the first analog signal. In this embodiment, one ADC is sufficient to scan all the analog signals received by the first single analog inputs.

Particularly, the device comprises a wave generator with at least one fifth analog output for yielding a second analog signal having a frequency and an amplitude that is programmable by the front-end controller. The resulting analog signal is a periodic signal such as a sine wave or any other periodic signal suited for synchronization.

More particularly, for detecting or measuring, the present invention comprises at least one stimulation electrode tied to the fifth output and P sensor electrodes connected to each of the second single analog inputs.

For special applications such as commands activated by touching a finger on a surface, the stimulation electrode and the sensor electrodes are printed on a flexible band so as to constitute a finger print captor. The first and second multiplexers, the phase sensitive amplifier, the ADC, the front-end controller and the wave generator are encapsulated in an integrated circuit connected to the flexible band.

Another embodiment is a method according to the principles of the present invention for generating a number (P) of first digital signals each coding an amplitude value of one first analog signal having a set frequency (F) comprising the steps of:

1) sampling a number (N) of first analog signals and measuring the amplitude value for each of the N first analog signals sampled during a period of the first analog signal;
2) successively generating N digital signals, each coding the analog amplitude value of the N first analog signals during the same period of the first analog signal; and
3) iterating M times the first and second steps for different first analog signals so as to sample a complete number (P) of first analog signals.

The first step allows sampling and measuring a complete subset of analog signals at once during a same period of an analog signal. The second step allows sequentially digitizing the subset's measurements during the same period. The third step allows digitizing a complete set of analog signal measurements with a short delay between two subsequent digitalizations of a same subset, increasing the real time performance of the digital measurements.

Advantageously, to measure physical features of a body not generating analog signals, the method comprises a fourth step for continuously yielding a second analog signal having a periodic form with programmable frequency and amplitude, and for applying the second analog signal to the body so that a set of P different points on the body each generate one of the first analog signals with an amplitude value the result of the combination of the programmable amplitude and the physical features of the corresponding point on the body.

Particularly, the first digital signals are computed to detect movement of the body when the set of P different points change corresponding to a changing physical feature.

Also, the first digital signals are computed to draw a map of points of the body along its changing physical features generating the first analog signals.

BRIEF DESCRIPTION OF THE DRAWINGS

A more complete understanding of the method and apparatus of the present invention may be acquired by reference to the following Detailed Description when taken in conjunction with the accompanying Drawings wherein.

DETAILED DESCRIPTION OF THE DRAWINGS

Figure 1:
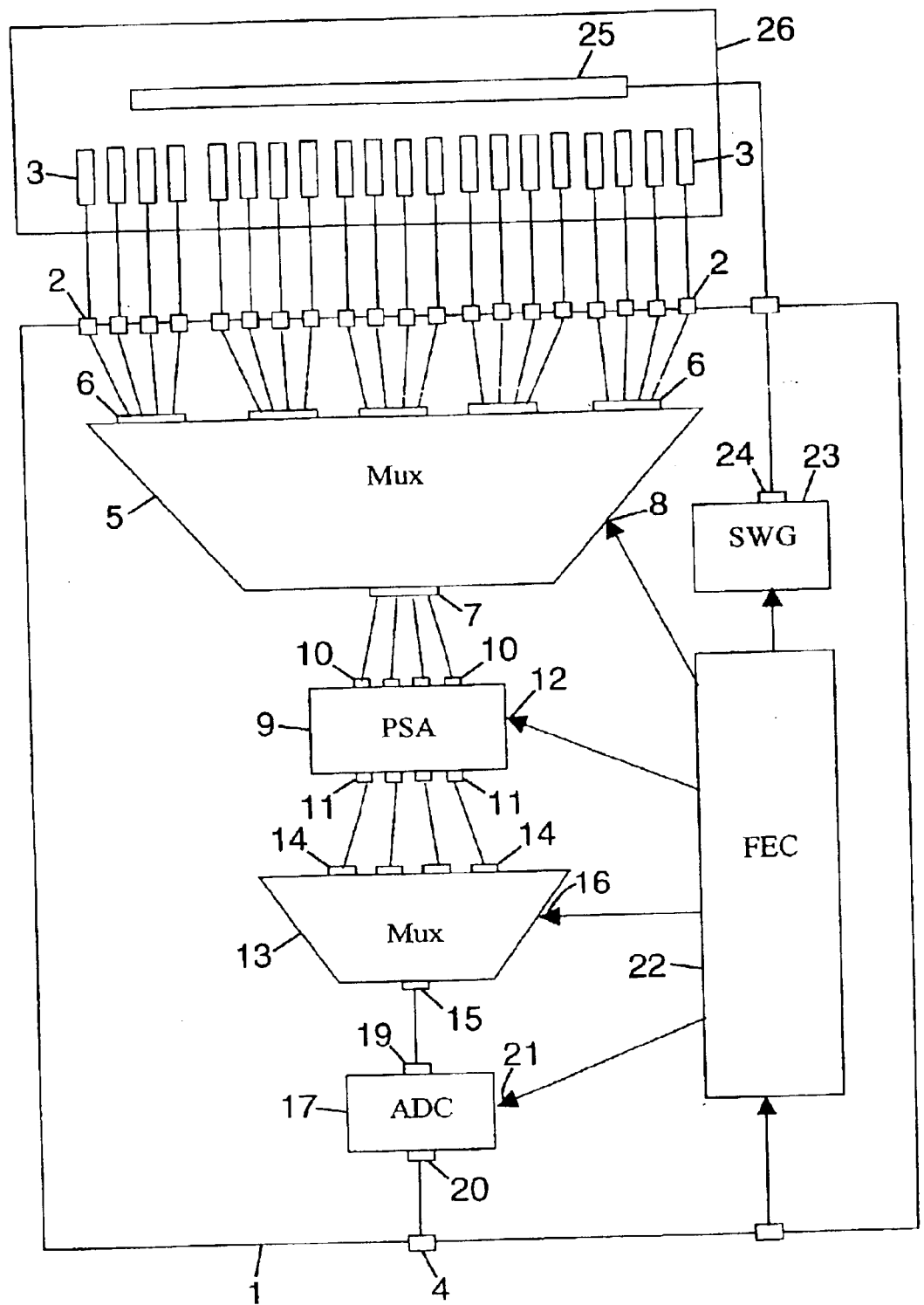
FIG. 1 is a schematic showing the arrangement of components of a device according to the principles of the present invention.

Referring to FIG. 1, one or more stimulation electrodes 25 and a plurality of sensor electrodes 3 are, for example, printed on a flexible sheet 26. Such an arrangement is useful for bio-impedance measurement systems by applying a periodic electrical tension signal with a set frequency or frequencies to one or more stimulation electrodes 25. When a body part such as a human finger is in contact with both the stimulation electrode 25 and the sensor electrode 3, a biological electrical transfer function is reflected through an amplitude and/or phase modulation of the original signal received as a first analog signal on the stimulation electrode 25. It should be noted that a fingerprint has ridges comprising mounts and valleys. With a stimulation electrode large enough to be in contact with a plurality of mounts and a sensor electrode small enough to be or not to be in contact with one mount, a different capacitive effect for a mount and a valley over the sensor electrode gives a different electrical transfer function between the stimulation electrode 25 and the sensor electrode 3, allowing detection of a mount or a valley over the sensor electrode 3.

In FIG. 1, an integrated circuit 1 comprises a wave generator (SWG) 23 with an output 24 connected to the one or more stimulation electrodes 25. The integrated circuit 1 further comprises analog inputs 2 for receiving analog signals from the corresponding sensor electrodes 3. When the wave generator 23 yields an analog signal having a set frequency F and a set amplitude A, each analog signal received by the inputs 2 has the same frequency F but with a phase and an amplitude A' which is a function of the capacitive effect between the stimulation electrode 25 and the corresponding sensor electrode 3. A digital output 4 of the integrated circuit 1 is provided for sequentially generating P number of digital signals coding the amplitude values of one analog signal. The P digital signals of the output 4 allow another circuit not shown in FIG. 1, such as a microprocessor running a program, to recognize the mounts and valleys of a fingerprint in touch with the stimulation electrodes 3.

The integrated circuit 1 of FIG. 1 further comprises a multiplexer 5 comprising a number (M) of multiple analog inputs 6 each connected to an equal number (N) of inputs 2. The multiplexer 5 further comprises a multiple analog output 7 and a command input 8 for sequentially connecting the multiple analog output 7 on one of the multiple analog inputs 6. The numbers N and M are chosen so that their product is at least equal to P. A front-end controller 22 pilots the wave generator 23. For example, the front-end controller outputs a clock signal and a reference amplitude to the wave generator 23. The wave generator 23 is, for example, a filter adjusted to yield a sinusoidal signal, having a frequency of the clock signal and an amplitude of the reference amplitude of the clock signal. The front-end controller 22 sets the command input 8 with a new value at each signal of the clock which starts a period of the analog signal generated by the wave generator 23. The multiplexer 5 represented in FIG. 1 has M equal to five multiple analog inputs. In this case, five different values are cycled applied to the command input 8.

Figure 3:
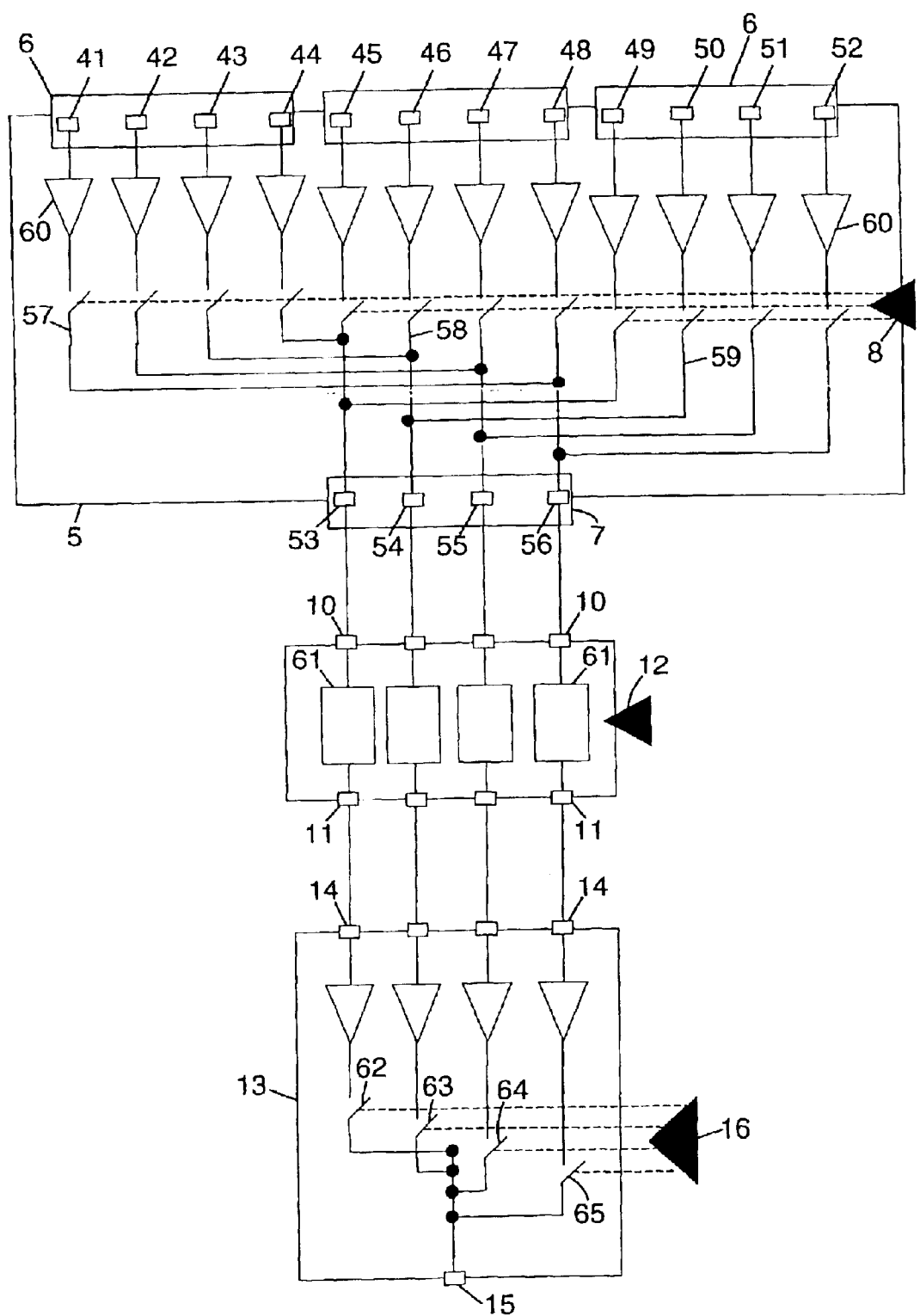
FIG. 3 is a more detailed schematic of the device of FIG. 1.

Referring to FIG. 3, the multiplexer 5 is represented in greater detail but, for simplicity, with M equal to three multiple analog inputs 6. Each multiple analog input 6 has N equal to four single analog inputs 41 to 14, 45 to 48, 49 to 52. The multiple analog output 7 has the same number N equal to four single analog outputs 53 to 56. A four channel switch 57 is provided to connect the single analog input 41 to the single analog output 56, the single analog input 42 to the single analog output 55, the single analog input 43 to the single analog output 54, the single analog input 44 to the single analog output 53, when the command input 8 is set with a value therefore. Likewise, a four channel switch 58 is provided to connect the single analog input 45 to the single analog output 53, the single analog input 46 to the single analog output 54, the single analog input 47 to the single analog output 55, the single analog input 48 to the single analog output 56, when the command input 8 is set with another value therefore. Again, a four channel switch 59 is provided to connect the single analog input 49 to the single analog output 53, the single analog input 50 to the single analog output 54, the single analog input 51 to the single analog output 55, the single analog input 52 to the single analog output 56, when the command input 8 is set with still another value therefore.

The multiplexer 5 of FIG. 3 further comprises an amplifier 60 on each channel between analog inputs 41 to 52 and analog outputs 53 to 56.

Referring again to FIG. 1, the integrated circuit 1 further comprises a phase sensitive amplifier 9 comprising N equal to four single analog inputs 10, each connected to the second single analog output 53, 54, 55, 56 of the multiplexer 5 of FIG. 3, a same number N equal to four single analog outputs 11, and a command input 12. Between each single analog inputs 10 and each single analog outputs 11, is connected, for example, an integrator 61 operable on the positive rectified portion of the analog signal. The integrator 61 is reset by a pulse value received on the command input 12. The front-end controller 22 is designed for setting the command input 12 with a pulse value at the beginning of each period of the first analog signal. Each integrator 61 generates on single analog outputs 11 an analog amplitude value of the analog signal received on the corresponding analog inputs 10 during the second half of the period of the first analog signal.

The integrated circuit 1 of FIG. 1 further comprises a multiplexer 13 comprising N equal to four single analog inputs 14, each tied to a single analog output 11 of the phase sensitive amplifier 9, a single analog output 15 and a command input 16 for connecting the single analog output 15 sequentially on one of the single analog inputs 14.

Referring to FIG. 3, the multiplexer 13 further comprises a one channel switches 62, 63, 64, 65 which connect one of the single analog inputs 14 to the single analog output 15 corresponding to the value applied on the command input 16. The front-end controller 22 of FIG. 1 is operable for setting the command input 16 with a null value during the first period of analog signal yielded by wave generator 23 so as to open each switch 62, 63, 64, 65 during first period of the analog signal. The front-end controller 22 is further designed for setting the command input 16 with a succession of N new values during the second period of analog signal yielded by wave generator 23 so as to successively close each switch 62, 63, 64, 65 during the second period of the analog signal.

Referring again to FIG. 1, the integrated circuit 1 further comprises an ADC 17 comprising a single analog input 18 connected to the single analog output 15 of the multiplexer 13, a single digital output 20 tied to the first output 4 of the integrated circuit 1 and a command input 21. The front-end controller 22 is operable for setting the command input 21 with a succession of N pulse values, each pulse value is generated during the time which a new value is applied on command input 16. In this way, the ADC 17 is able to generate a digital signal coding the amplitude of the analog value received on the single analog input 19 for each single analog input 14 connected on the analog output 15.

Figure 2:
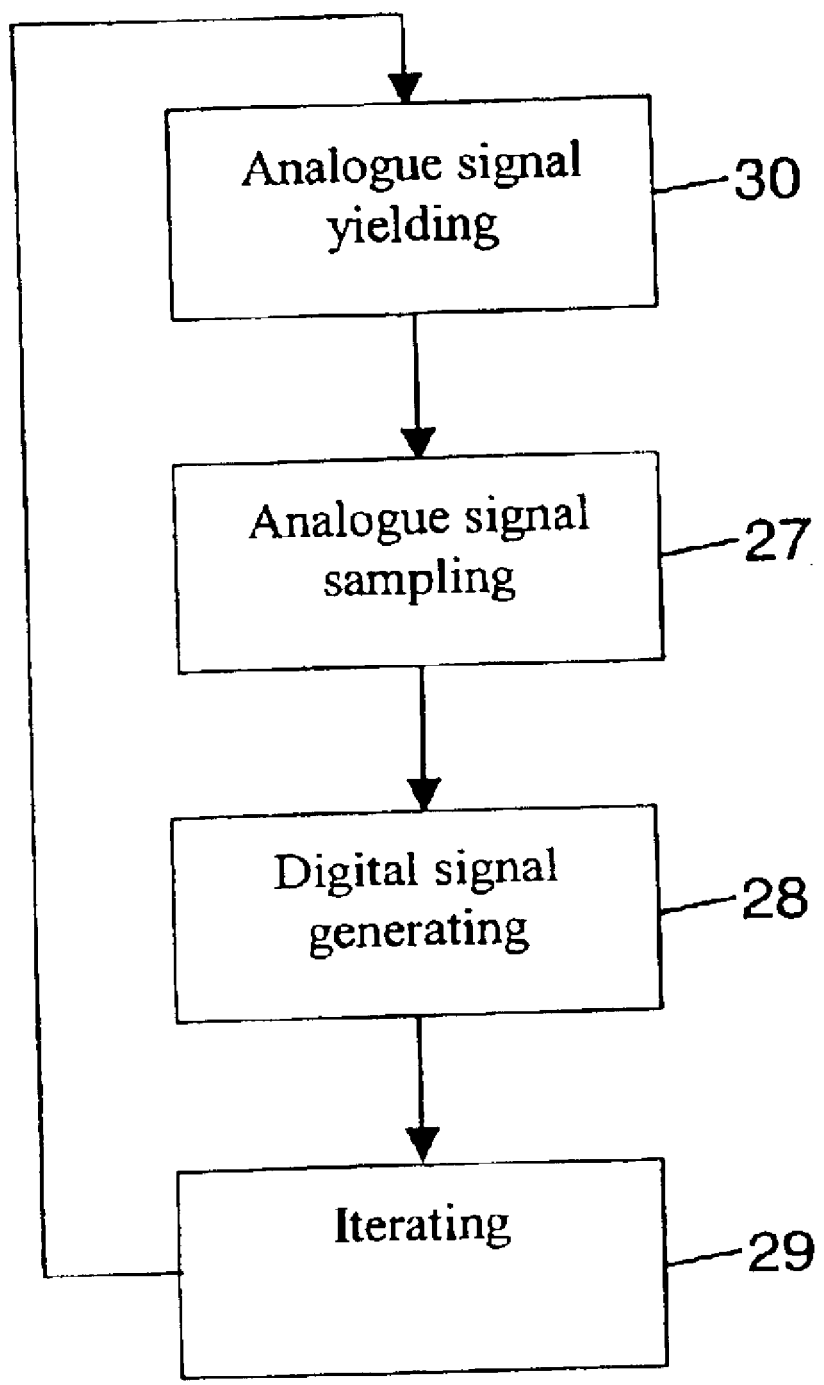
FIG. 2 is a flow chart of a method according to the principles of the present invention.

FIG. 2 is a block diagram of a method for generating a number (P) of digital signals each coding an amplitude value of one first analog signal having a frequency (F).

In a step 27, N analog signals are sampled during a period of the first analog signal. The amplitude value is measured at an analog stage for all the sampled N analog signals during the same time.

In a step 28, each measured analog signal is converted to digital form, thereby successively generating one of N digital signals, each coding the amplitude of the analog value of the N first sampled analog signals, during a same time period of one analog signal.

A step 29 is provided for iterating M times steps 27 and 28 for other analog signals in such a manner so as to sample a complete number P of first analog signals.

In other embodiments of the present invention, such as measuring applications in electrical environments, for example in the study of an appliance's electrical behavior or a natural phenomenon, the analog signals can come from external sources like alternating currents on a power line.

In still other embodiments of the present invention, such as the studying of physical features of different points of a body, a step 30 is provided for continuously yielding a periodic analog signal having a programmable frequency and amplitude, and for applying the analog signal to the body in such a way that a set of P different points of the body each generate one analog signal to be measured with an amplitude value the result of the combination of the programmable amplitude and the physical features of the corresponding point on the body. The advantage of the programmable frequency is the ability to adjust the frequency in a manner to get a high variation of the transfer function for different physical features.

Figure 4:
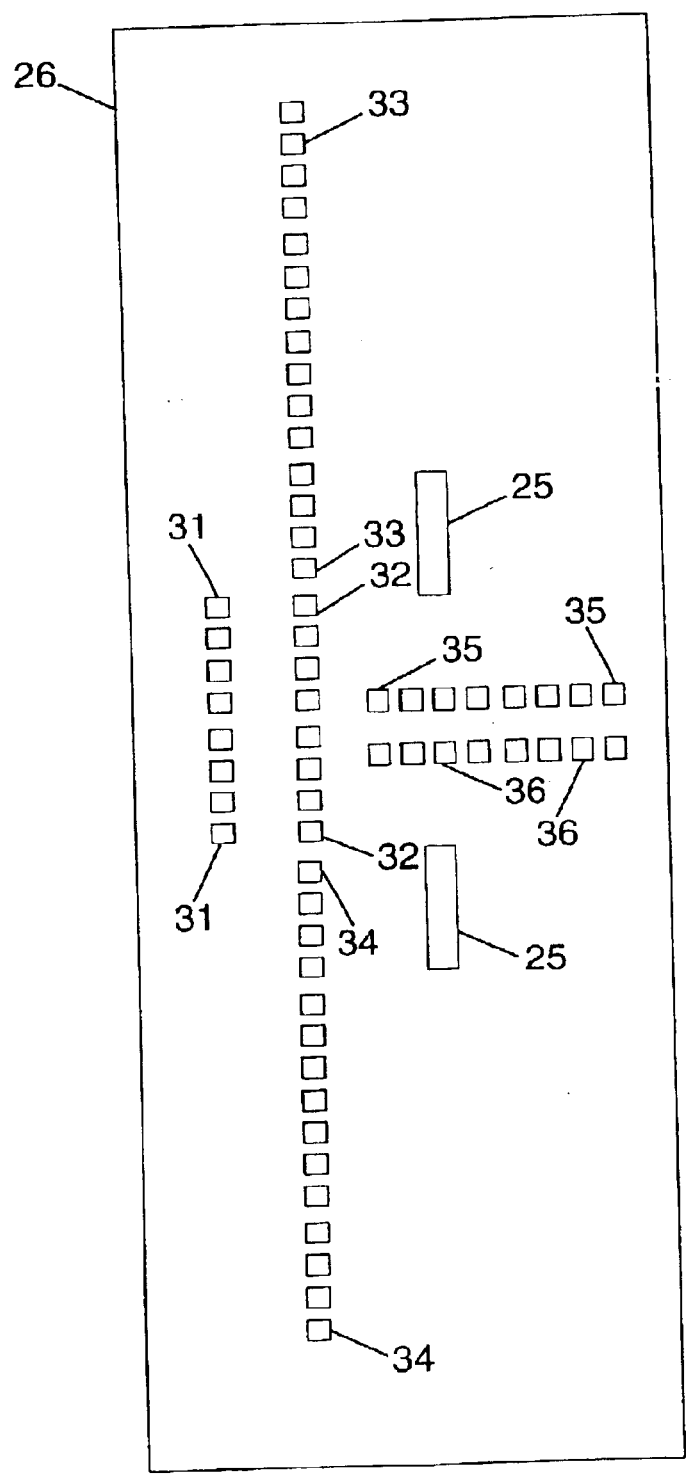
FIG. 4 is a special arrangement of sensors for an embodiment according to the principles of the present invention.

Referring to FIG. 4, the sensor electrodes 3 of FIG. 1, further differentiated with reference to sensor electrodes 31 to 36, and the stimulation electrode 25 of FIG. 1 are printed on a flexible sheet 26.

The flexibility of the sheet is particularly suited to resist the pressures applied by a physical body like a finger in contact with the sheet. It should be noted in FIG. 4 that the width of the sheet 26 is proportionally smaller than its length. The small width of the sheet is particularly suited for implementing it on the front face of a mobile phone where a screen and a keyboard already exist. The length value of the sheet 26 is approximately equal to the overall width of a finger.

A first straight line of sensor electrodes 32, 33, 34, is printed on the surface of sheet 26 across its length. A square map of sensor electrodes covering the surface of a fingerprint would be too cumbersome to produce on the front face of a small appliance such as a mobile phone or a personal organizer. A line is sufficient when associated with a movement of the body across the line.

A smaller, second straight line with sensor electrodes 31 is printed at a predetermined short distance away from and in parallel with the first straight line.

The sensor electrodes 31 to 36 and the stimulation electrodes 25 shown in FIG. 4 are connected to the integrated circuit 1 in a manner similar to that shown in FIG. 1.

Contiguous sensor electrodes are not necessarily connected to a same multiple analog input of the multiplexer 5 of FIG. 1. One skilled in the art is free to choose a topology of connections that is estimated to best suit a scan in real time of the physical features of a body, such as a fingerprint. The integrated circuit 1 of FIG. 1 is mounted, for example, under the sheet 26 of FIG. 4 in such a manner so as to be protected against pressure when the body is in contact with the sheet 26.

The digital signals sequentially generated during a sampling period by output 4 for analog signals originating from sensor electrodes 32, 33, 34, give a first horizontal transverse section of the fingerprint with a first pattern of mounts and valleys along the first section.

The digital signals sequentially generated during the same sampling period by output 4 for analog signals originating from sensor electrodes 31 give a second horizontal transverse section of another part of the fingerprint at a perpendicular distance equal to the predetermined distance between the first and second straight lines of sensor electrodes. This gives a second pattern of mounts and valleys along the second section.

A processor running a program, not shown in FIG. 4, would be provided to detect the second pattern in the first pattern during a subsequent sampling period when a finger moves from the second straight line to the first straight line. The oriented distance on the fingerprint between the first pattern for the following sampling period and the first pattern for the preceding sampling period is equal to the known distance between the set of sensor electrodes 31 and the set of sensor electrodes 32, 33, 34, corresponding to the detected second pattern. The movement of the finger does not necessarily need to be rigorously perpendicular to the first and second straight lines. When the finger moves a small amount to the right, the second pattern is detected for some right situated sensor electrodes 32 and for a complement of some left situated sensor electrodes 33. When the finger moves a small amount to the left, the second pattern is detected for some left situated sensor electrodes 32 and for a complement of some right situated sensor electrodes 34. When the finger moves more to the right, the second pattern is detected for some sensor electrodes 33. When the finger moves more to the left, the second pattern is detected for some sensor electrodes 34. The distance is computed with known trigonometric considerations using the known distances between the sensor electrodes.

An acceptable map of the fingerprint is obtained when the finger has finished moving across the first straight line.

This embodiment of sensor electrodes is suitable not only to scan a fingerprint but also to detect a displacement of a finger in a first crossing direction centered on the perpendicular direction with an angle tolerance of more than 45 degrees on each side. Correlated to a clock generator, the displacement detection allows measurement of the speed of the crossing finger.

Referring again to FIG. 4, a third straight line perpendicular to the first straight line, comprising sensor electrodes 35 is printed on sheet 26. A fourth straight line, parallel to the third line, comprising sensor electrodes 36 is also printed on sheet 26. The third and fourth straight lines detect displacement of the finger across them in a second crossing direction centered on perpendicular direction with an angle tolerance of more than 45 degrees on each side. The third and fourth straight lines need not be as long as the first and second straight lines, respectively, because they are not provided for fingerprint scanning, but for displacement detection in a direction around the horizontal direction.

A correlation of first and second crossing directions by a computer means procures a direction with distance of displacement of the finger on the fingerprint captor constituted by the sheet 26. Such a procured displacement is useful for pointer and navigation functions on the screen of a mobile phone.

It is understood that the teaching of the invention is not limited to the particular embodiment here above described and that many variants can be implemented by the man skill in the art. For example, in the case where the number of sensor electrodes is greater or in the case where it is preferable to have slower ADCs, the above previous described elements of the integrated circuit of FIG. 1, elements 5, 9, 13 can be duplicated in parallel for two or more groups of different sensor electrodes with a different ADC 17 for each output of multiplexer 13 associated with a group. When only one output 4 of integrated circuit 1 is provided, a further multiplexer not represented can be introduced with as many inputs as there are groups, each connected to one output 20 of ADC 17 for a group. An output of the further multiplexer is therefore connected the output 4 instead of connecting an output 20 of single ADC to the output 4.

Although preferred embodiments of the method and apparatus of the present invention have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth and defined by the following claims.

What is claimed is:

1. A device having a number P of first single analog inputs for each receiving a first analog signal having a frequency F from a sensor electrode and a first single digital output for sequentially generating a number P of first digital signals each coding an amplitude value of the first analog signal, comprising:

a first multiplexer having a number M of first multiple analog inputs each comprising a number N of second single analog inputs connected to the first single analog inputs for receiving the first analog signal, a first multiple analog output comprising a number N of second single analog outputs, and a first command input for connecting the first multiple analog output sequentially to each one of the first multiple analog inputs;

a phase sensitive amplifier having a number N of third single analog inputs connected to the second single analog outputs of the first multiplexer, a number N of third single analog outputs, and a second command input for generating on each third single analog output an amplitude analog value of an analog signal received on the corresponding third single analog input;

a second multiplexer having a number N of fourth single analog inputs connected to the third single analog outputs of the phase sensitive amplifier, a fourth single analog output, and a third command input for connecting the fourth single analog output sequentially to each one of the fourth single analog inputs;

an analog to digital converter having a fifth single analog input connected to the fourth single analog output of the second multiplexer, a second single digital output tied to the first output of the device, and a fourth command input for generating the first digital signals coding the amplitude analog values received on the fifth single analog input; and a front-end controller operable for setting the first command input with a first new value and the second command input with a first pulse value at the beginning of each period of the first analog signal, the third command input with a succession of N second new values, and the fourth command input with a succession of N second pulse values at a time delayed after the beginning of each period of the first analog signal;

wherein the second new value is set for connecting the fourth single analog output on a different fourth single analog input so as to connect the fourth single analog output on all the fourth single analog inputs during a period of the first analog signal; and wherein the second pulse value is set to a succession of N pulse values generated during the time which the second new value is applied.

2. The device according to claim 1, wherein the numbers N and M are chosen so that their product is at least equal to P.

3. The device according to claim 1, wherein N is equal to the number of analog amplitude values for which the analog to digital converter is suited to generate digital signals coding the analog amplitude value during a period of the first analog signal.

4. The device according to claim 1, wherein the first new value is set for connecting the first multiple analog output on a different first multiple analog input during a period of the first analog signal, so as to connect the first multiple analog output on all the first multiple analog inputs during M periods of the first analog signal.

5. The device according to claim 1, wherein the first multiplexer further comprises an amplifier between the second single analog inputs and the second single analog outputs.

6. The device according to claim 5, wherein the stimulation electrode and the sensor electrodes are printed on a flexible band so as to constitute a finger print captor, and the first and second multiplexers, the phase sensitive amplifier, the analog to digital converter, the front-end controller, and the wave generator are encapsulated in an integrated circuit connected to the flexible band.

7. The device according to claim 1, wherein the second multiplexer further comprises an amplifier between the fourth single analog inputs and the fourth single analog outputs.

8. The device according to claim 1, wherein the phase sensitive amplifier comprises an integrator connected between the third single analog inputs and the third single analog outputs.

9. The device according to claim 8, wherein the first pulse value is set for resetting the integrator at the beginning of each period of the first analog signal.

10. The device according to claim 1, further comprising a wave generator with at least one fifth analog output for yielding a second analog signal having a frequency and an amplitude programmable by the front-end controller.

11. The device according to claim 10, further comprising at least one stimulation electrode tied to the fifth output, and a number P of sensor electrodes each connected to one of the second single analog inputs.

12. A method for generating a number P of first digital signals coding the amplitude values of a plurality of first analog signals having a frequency F, comprising the steps of:

sampling a number N of first analog signals and measuring the analog amplitude value for the N first analog signals sampled during one period of the first analog signals;

generating in succession N digital signals coding the analog amplitude values of the N first analog signals during one period of the first analog signals; and iterating M times the sampling and generating steps for different first analog signals in a manner so as to sample a complete number P of first analog signals.

13. The method according to claim 12, further comprising the steps of:

continuously yielding a second analog signal having a periodic form with programmable frequency and amplitude; and applying the second analog signal to a body such that a set of P points of the body generate a set of P first analog signals having amplitude values the result of the programmable amplitude and the physical features of the corresponding point on the body.

14. The method according to claim 13, further comprising the step of computing the first digital signals to detect a movement of the body when the set of P different points change so as to change their physical features.

15. The method according to claim 14, further comprising the step of computing the first digital signals to draw a map of points of the body along the changing physical features generating the first analog signals.

16. A device, comprising:

a first multiplexor having an input and an output, the input receiving a plurality of input signals arranged in plural input signal groups, the first multiplexor operable to choose which of the input signal groups is to be connected to the first multiplexor output;

an amplifier having an input and an output, the amplifier input connected to the first multiplexor output to receive the input signals of the first multiplexor chosen input signal group, the amplifier operable to generate at the output amplified input signals of the first multiplexor chosen input signal group; and a second multiplexor having an input and an output, the second multiplexor input connected to the amplifier output to receive the amplified input signals of the first multiplexor chosen input signal group, the second multiplexor operable to choose which amplified input signal in the first multiplexor chosen input signal group is to be connected to the second multiplexor output; and a controller connected to each of the first multiplexor, amplifier and second multiplexor, the controller issuing a first command signal causing the first multiplexor to choose sequentially over each of the plural input signal groups for connection to the first multiplexor output, the controller further issuing a second command signal causing the second multiplexor to choose sequentially over each of the amplified input signals in the first multiplexor chosen input signal group for connection to the second multiplexor output;

wherein each of the plurality of input signals is an analog signal generated responsive to a reference signal having a certain frequency such that each of the plurality of input signals has the same certain frequency with possibly differing phases and amplitudes;

wherein the controller changes the first command signal with each new period of the certain frequency reference signal to choose sequentially over each of the plural input signal groups; and wherein the controller changes the second command signal a plural number of times within each new period of the certain frequency that corresponds to a number of the input signals arranged in each of the plural input signal groups to choose sequentially over each of the amplified input signals within the first multiplexor chosen input signal group.

17. The device of claim 16, wherein the amplifier comprises integration circuitry and the controller issues a third command signal at each new period of the certain frequency reference signal to reset that integration circuitry.

18. The device of claim 17, further comprising an analog-to-digital converter having an input connected to the second multiplexor output, the analog-to-digital converter receiving a sequence of amplified input signals and generating a corresponding sequence of digital output samples.

19. The device of claim 18, wherein the device is connected to a plurality of devices, each receiving a plurality of input signals arranged in input signal groups.

20. A method for sampling an input signal from a plurality of input signals, comprising the steps of:
   generating a plurality of analog signals responsive to a reference signal having a certain frequency;
   generating each of a plurality of input signals from the plurality of analog signals, wherein each of the plurality of input signals has the same certain frequency with possibly differing phases and amplitudes;
   choosing sequentially each of an input signal group from the plurality of input signals arranged in plural input signal groups;
   amplifying the chosen input signal group; and
   choosing sequentially each of an input signal from the amplified input signal group;
   wherein the step of choosing sequentially each of the plural input signal groups further comprises the step of choosing sequentially each of the plural input signal groups at each new period of the certain frequency reference signal:
   wherein the step of choosing sequentially each of the amplified input signals in the chosen input signal group further comprises the step of choosing sequentially each of the amplified input signals in the chosen input signal group a number of times within each new period of the certain frequency that corresponds to a number of the input signals arranged in each of the plural input signal groups.

21. The method according to claim 20, wherein the step of amplifying the chosen input signal group comprises the steps of:
   integrating the chosen input signal group in an integrator; and
   resetting the integrator at each new period of the certain frequency reference signal.

22. The method according to claim 21, further comprising the steps of:
   receiving a sequence of amplified input signals; and
   generating a corresponding sequence of digital output samples.

23. A method for measuring P plural analog signals sharing a common frequency F, comprising:
   sampling a set of N plural analog signals during a period 1/F of the analog signals;
   converting the N plural sampled analog signals to digital form so as to generate a set of N plural digital signals during the same period 1/F; and
   repeating sampling and converting M plural times for successive different sets of N plural analog signals so as to sample and convert the P plural analog signals to P plural digital signals over N periods 1/F.

24. The method of claim 23, wherein the P plural analog signals sharing the common frequency F have varying amplitudes and phases with respect to each other.

25. A system for measuring P plural analog signals sharing a common frequency F, comprising:
   means for sampling a set of N plural analog signals during a period 1/F of the analog signals;
   means for converting the N plural sampled analog signals to digital form so as to generate a set of N plural digital signals during the same period 1/F; and
   a controller operable to cause the means sampling and means for converting to repeat the performed operations for sampling and converting M plural times for successive different sets of N plural analog signals so sample and convert the P plural analog signals to P plural digital signals over N periods 1/F.

26. The system of claim 25 wherein the P plural analog signals sharing the common frequency F having amplitudes and phases with respect to each other.

* * * * *

UNITED STATES PATENT AND TRADEMARK OFFICE
CERTIFICATE OF CORRECTION

PATENT NO. : 6,836,230 B2
DATED : December 28, 2004
INVENTOR(S) : Laurent Le Pailleur, Knut Hovring Riisnaes and Ovidiu Vermesan It is certified that error appears in the above-identified patent and that said Letters Patent is hereby corrected as shown below:

Column 4,
Line 67, please replace "14" with -- 44 --.

Column 10,
Line 37, please delete "and".

Column 11,
Line 36, please replace ":" with -- ; --.

Column 12,
Line 41, please replace "having" with -- have varying --.

Signed and Sealed this

First Day of November, 2005

JON W. DUDAS
*Director of the United States Patent and Trademark Office*